(12) United States Patent
Kopf et al.

(10) Patent No.: US 8,750,344 B2
(45) Date of Patent: Jun. 10, 2014

(54) LASER PUMP ARRANGEMENT AND LASER PUMP METHOD WITH BEAM HOMOGENIZATION

(75) Inventors: Daniel Kopf, Roethis (AT); Maximilian Lederer, Hamburg (DE)

(73) Assignee: High Q Laser GmbH (AT)

( * ) Notice: Subject to any disclaimer, the term of this patent is extended or adjusted under 35 U.S.C. 154(b) by 258 days.

(21) Appl. No.: 13/128,469

(22) PCT Filed: Nov. 6, 2009

(86) PCT No.: PCT/EP2009/064761
§ 371 (c)(1),
(2), (4) Date: Oct. 24, 2011

(87) PCT Pub. No.: WO2010/052308
PCT Pub. Date: May 14, 2010

(65) Prior Publication Data
US 2012/0033704 A1    Feb. 9, 2012

(30) Foreign Application Priority Data
Nov. 10, 2008    (EP) .................................... 08168736

(51) Int. Cl.
*H01S 3/10*    (2006.01)
*H01S 3/093*    (2006.01)
*H01S 3/08*    (2006.01)

(52) U.S. Cl.
USPC ................................ 372/101; 372/25; 372/72

(58) Field of Classification Search
USPC ............................................. 372/25, 72, 101
See application file for complete search history.

(56) References Cited

U.S. PATENT DOCUMENTS

| 5,307,430 | A | * | 4/1994 | Beach et al. ..................... 385/31 |
| 5,936,984 | A | * | 8/1999 | Meissner et al. ................ 372/34 |
| 6,594,299 | B1 | | 7/2003 | Hirano et al. |
| 2006/0153257 | A1 | | 7/2006 | Franjic et al. |

FOREIGN PATENT DOCUMENTS

| DE | 198 03 728 A1 | 1/1999 |
| EP | 0 632 551 | 1/1995 |
| EP | 1 198 039 A | 4/2002 |
| EP | 1 181 754 | 3/2003 |
| EP | 1 629 576 | 12/2006 |

OTHER PUBLICATIONS

Lucianetti A et al, "Beam-Quality Improvement of a Passively Q-Switched ND: Yag Laser with a Core-Doped Rod", Applied Optics, OSA, Optical Society of America, Washington, DC, Bd. 38, Nr. 9, 20. Mar. 1999, pp. 1777-1783, XP000828590.

(Continued)

*Primary Examiner* — Armando Rodriguez
(74) *Attorney, Agent, or Firm* — Muncy, Geissler, Olds & Lowe, P.C.

(57) ABSTRACT

In a laser pump arrangement for a laser medium that amplifies a laser beam, comprising at least one laser pump source (1") with a plurality of emitters for generating partial pumping streams (TPS1", TPS2"), the partial pumping streams (TPS1", TPS2") are led through a coupling optic to a homogenizer (3") and then are thoroughly mixed in one axis through multiple reflections. In the process, the homogenizer (3") and the laser medium are designed and disposed such that the pump stream exiting the homogenizer (3") is led directly onto or into the laser medium while maintaining divergence in the mixing axis (DA), wherein the partial pumping streams (TPS1", TPS2") are projected, in particular focused, directly onto or into the laser medium in a projection axis (PA) that is perpendicular to the mixing axis (DA).

17 Claims, 9 Drawing Sheets

(56) References Cited

OTHER PUBLICATIONS

Beach, "Theory and optimization of lens ducts", Applied Optics, vol. 35, No. 12, Apr. 20, 1996, pp. 2005-2015.

Honea et al., "Analysis of an intracavity-doubled diod-pumped Q-switched Nd:YAG laser producing more than 100 W of power at 0.532 μm", Optics Letters, vol. 23, No. 15, Aug. 1, 1998, pp. 1203-1205.

* cited by examiner

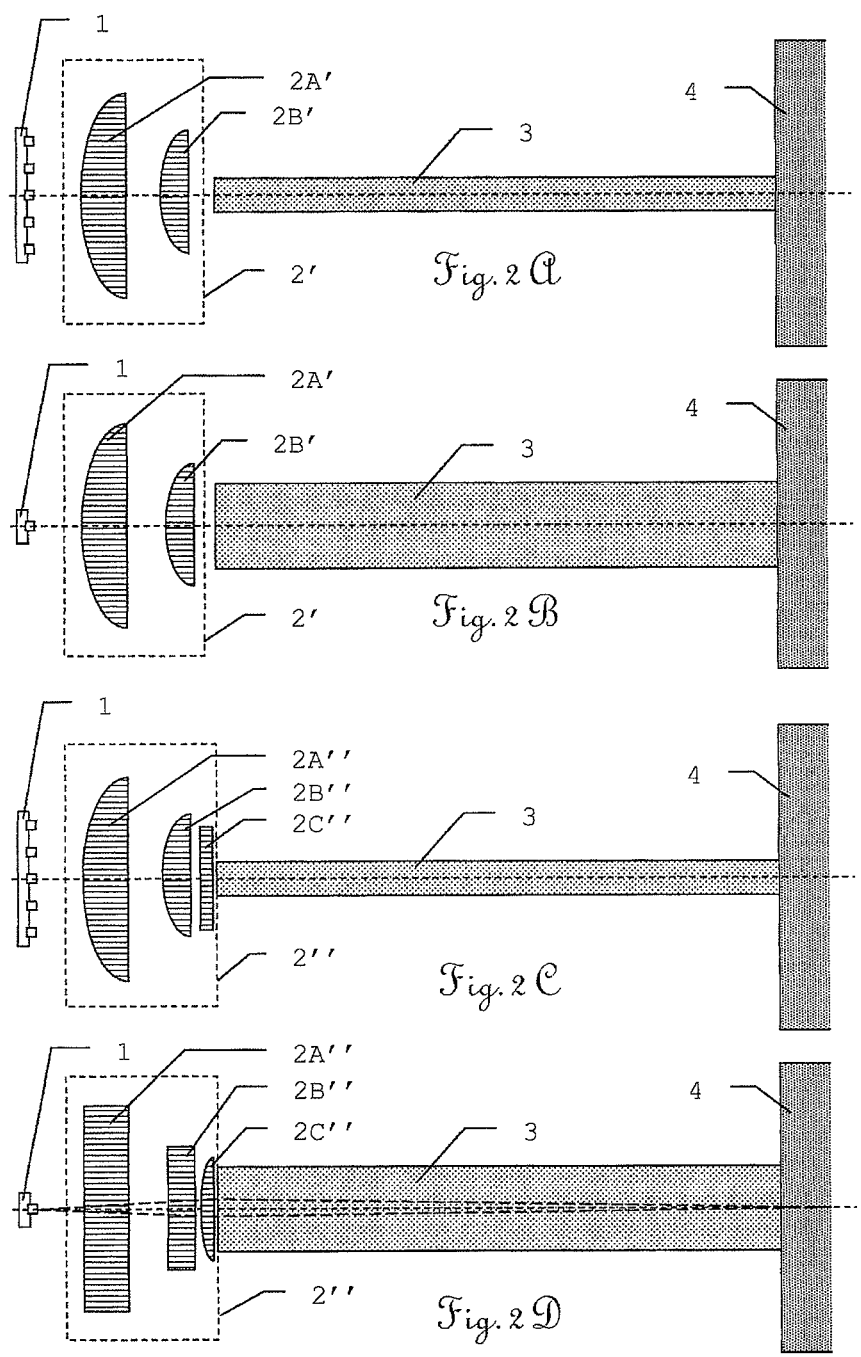

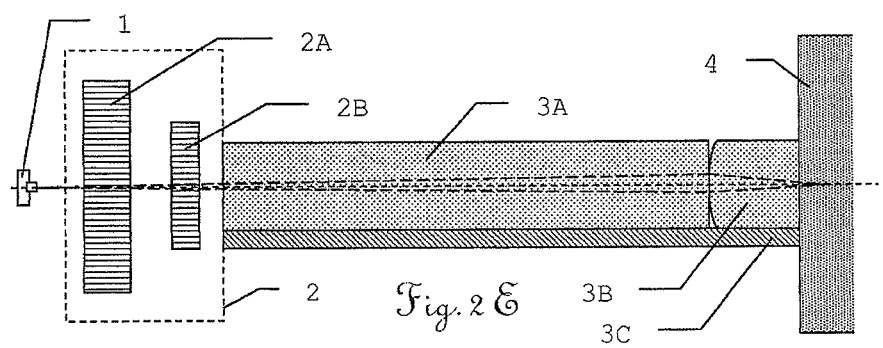
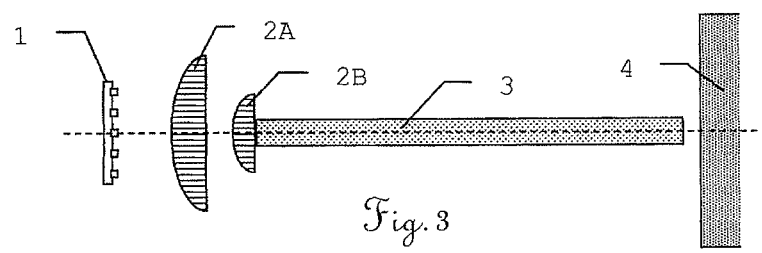
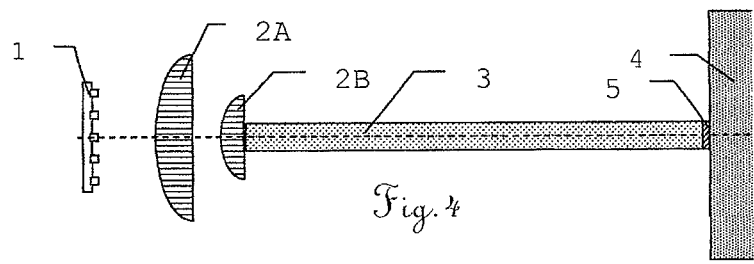
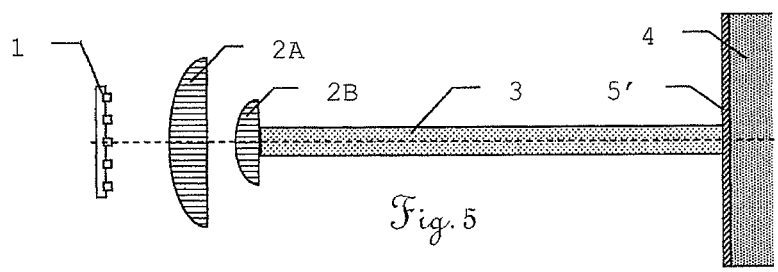

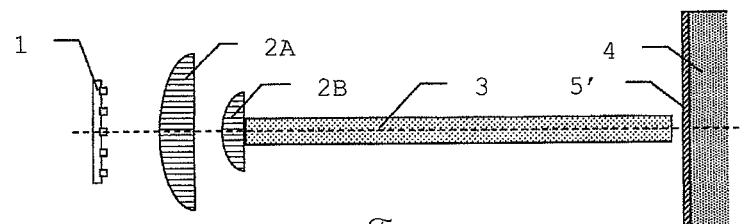
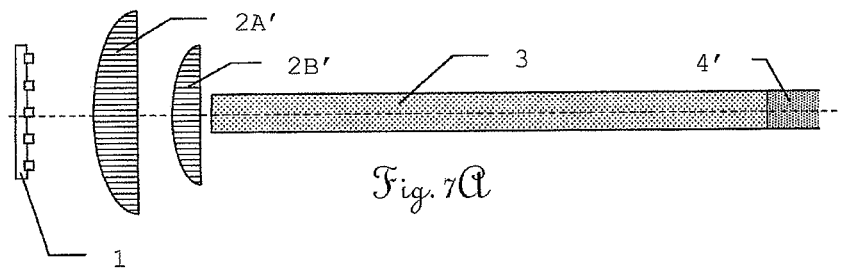
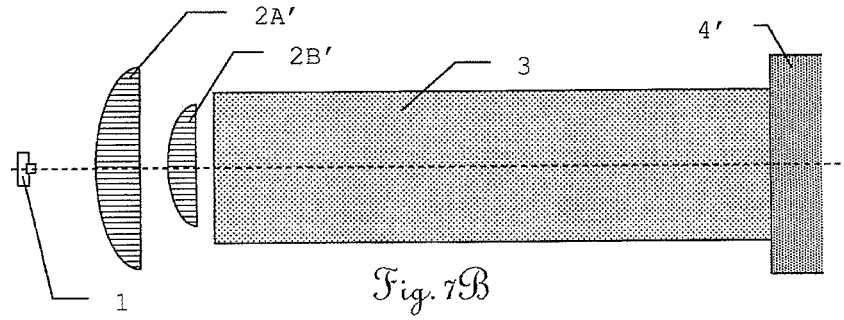
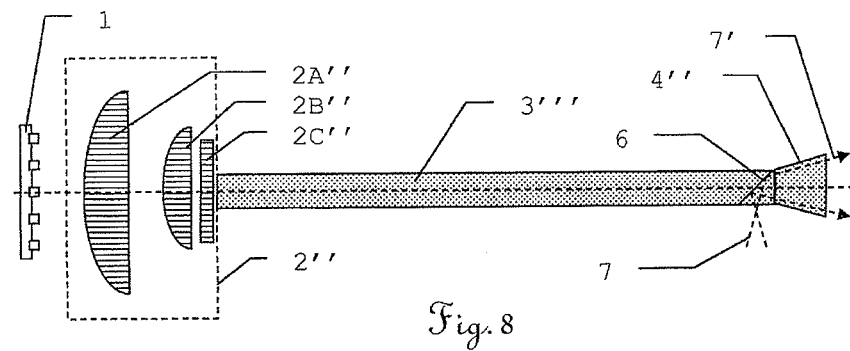

LASER PUMP ARRANGEMENT AND LASER PUMP METHOD WITH BEAM HOMOGENIZATION

This application is a national stage of International Application No.: PCT/EP2009/064761, which was filed on Nov. 6, 2006, and which claims priority to European Patent Application No.: 08168736.0, which was filed in Europe on Nov. 10, 2008, and which are both herein incorporated by reference herein in their entirety.

The invention relates to a laser pump arrangement for a laser medium that amplifies laser radiation according to the preamble of claim 1, a laser system equipped there with, and a laser pump method for a laser medium that amplifies laser radiation according to the preamble of claim 15.

Diode-pumped solid-state lasers constitute standard laser systems which are used in diverse applications. In this case, power scaling occurs in practice using various techniques. The basic problem generally consists of the fact that with increasing volumetric pump power density in the laser medium, thermally initiated effects such as, for example, thermal lenses, depolarizations or stress fractures lead to the degradation of the beam parameters or to the destruction of the laser medium. Moreover, aberrations of the laser mode occur to an increased extent if high-power pump sources required for the power scaling have only deficient homogenization.

Although scaling by enlarging the approximately round pump cross section is possible to a limited extent, it rapidly leads to difficulties in the adaptation of the laser mode.

Therefore, the prior art discloses various other approaches which strive to achieve power scaling, which avoid or at least reduce these negative effects.

A much better method of scaling is afforded e.g. by the concept of the disc laser with a round pump led back multiply into the laser medium, as is presented in EP 0 632 551 for example. In this case, thermal effects are reduced by a direct approach by means of the laser medium being made very thin and the cooling being carried out one-dimensionally in the direction of the thin extent of the laser medium.

The advantages achieved thereby consist in the fact that firstly a very small temperature boost results on account of the proximity of the heat sink and secondly the transverse gradients over the laser mode remain small since only negligible heat conduction takes place in this direction.

A continuation of this concept is described in EP 1 629 576. Here, through the use of a greatly elliptically focused pump arrangement into the disc, an additional thermal advantage is achieved by means of a two-dimensional heat flow giving rise to a lower peak temperature.

Advances in the field of fiber-coupled laser diodes have made it possible to achieve a continuous increase in the brilliance of such radiation sources, which can be utilized for achieving the scaling over the length of the laser medium. Specifically in connection with laser media having comparatively high amplifying cross sections, such as e.g. Nd:vanadates, very good successes are achieved with extremely simple constructions. The advances achieved in the last 10-20 years in crystal growth technology have likewise had a positive effect here. A consistent continuation of this concept ultimately leads to the fiber laser, which, similarly to the disc laser, enables very high output powers.

Finally, a further possibility of power scaling consists in so-called elliptical or highly elliptical pumping. In this case, a strong focus is maintained, e.g. in the vertical direction, in order to ensure the necessary small-signal gain. By contrast, the pumped volume is increased by widening in the other direction.

In this case, it is ensured that the power density related to area does not rise above the critical value for thermal effects. A corresponding approach is known from EP 1 318 578 for example. Scaling is thus achieved by the widening of the line. The laser medium geometry best suited to this approach is a rod or "slab", as is also described in EP 1 181 754. What is particularly important in this connection is a very homogeneous pump distribution along the line, since, in the case of inhomogenities, aberrations occur very rapidly in the laser mode. This can be solved e.g. by the light from a laser bar stack being guided by means of a plurality of lenses firstly via a homogenizer having total internal reflection at two sides as a planar waveguide, the exit area of which is then imaged into or onto the laser medium once again via a plurality of lenses. Such mixing or intermixing reduces the influence of pump beam sources that fail or change in terms of their power, such that a homogeneous or homogenized pump beam ensues which is imaged onto the laser medium as a pump light spot.

Consequently, although this approach allows intermixing of the emissions of different laser diodes in the stack, it is complex in terms of construction and adjustment on account of the lens systems used in the case of coupling into and out of the homogenizer. Moreover, the downstream optical units result in corresponding demands being placed on the space requirement of the laser system.

Consequently, generic laser systems comprising homogenizer rods in the prior art are too complex, complicated in terms of adjustment and/or too large owing to their construction and the components used.

Although other approaches, as described for example in Beach, Raymond J.: "Theory and optimization of lens ducts", Applied Optics, Vol. 35, No. 12, Apr. 20, 1996, pages 2005-2015, or Honea, Eric C. et al.: "Analysis of an intracavity-doubled diode-pumped Q-switched Nd:YAG laser producing more than 100 W of power at 0.352 µm", Optics Letters, Vol. 23, No. 15, Aug. 1, 1998, pages 1203-1205, dispense with an optical unit disposed downstream of the homogenizer, they are not suitable for producing highly elliptical pump spot geometries on account of the intermixing required for the described applications in two axes.

One problem addressed by the present invention consists in providing a more compact or simplified laser pump arrangement for producing elliptical pump geometries and also a laser system that uses the latter, in particular a diode-pumped solid-state laser system.

A further problem consists of providing such a laser system which has an improved robustness and reduced adjusting complexity.

These problems are solved, or the solutions are developed, by means of the subjects of claims 1 and 15 or of the dependent claims.

The invention relates to a pump arrangement and a pump method for laser media in which the partial beams of a plurality or multiplicity of pump beam sources are gathered, mixed and passed as a pump beam for producing elliptical pump geometries onto or into an amplifying laser medium. In this case, the cross section of the elliptical pump light spot to be obtained is described by the aspect ratio, where here ratios of pump light spot length to width of, for example, >3:1, in particular >15:1 or even higher are obtained.

The solution according to the invention for the homogenized pumping of a laser medium substantially constitutes a space-optimized system which can be constructed with a minimum number of standard lenses plus a homogenizer.

Space requirement and adjusting complexity are reduced as a result of the smaller number of lenses in comparison with the prior art.

In detail, the optical imaging of the homogenizer exit into the laser medium is dispensed with. Instead of that, both are arranged in direct proximity, e.g. positioned with a distance of 100-300 μm, such that the pump light is substantially guided further in the laser medium without the imaging of an actual pump light spot and with a specific cross section with maintenance of divergence, apart from the refraction at planar surfaces. The maintenance of divergence therefore means that, apart from the interactions upon entrance or passage into optical components, i.e. passing through entrance or exit windows, no beam shaping by elements configured for this purpose takes place in this regard. In this respect, the maintenance of divergence corresponds to a beam shaping freedom with regard to the change in divergence. The pump light is guided into the laser medium in a manner free of beam shaping with regard to its divergence.

The laser medium therefore functionally constitutes a lengthening of the homogenizer, wherein the homogenizer has a beam-shaping effect and provides a beam having the desired cross section or beam profile at its exit. In comparison with arrangements having imaging components, therefore, the function of beam shaping by a downstream lens is already effected by the homogenizer and the interplay thereof with a coupling-in optical unit.

The homogenizer as planar optical waveguide can in this case have polished or else coated or reflectively coated side areas in order to enable guidance by total internal reflection. In this case, the dimensions of the homogenizer are chosen such that, in the direction of intermixing, the required width of the pump beam arises in the laser medium and the intermixing is sufficiently complete, i.e. remains below a tolerance threshold for deviation from the desired profile of the homogeneous profile. Since a linear sequence of laser diodes in the form of laser bars or lines is used in most laser systems, an intermixing of the spatially offset partial beam bundles brought about by this arrangement takes place in one axis. This eliminates the influence of the different originating locations or forces it below a predefined threshold.

One prerequisite for the desired intermixing is the coupling of the partial beams into the homogenizing element in a manner optimized for this purpose, which is possible through the choice of cylindrical coupling-in lenses that are suitable in the intermixing direction. In this case, divergence and length of the homogenizer are in a dependency ratio, that is to say that a high divergence enables a short homogenizer, whereas a low divergence requires a long homogenizer. The large entrance and exit angles that arise in the case of high divergence and also the associated reflection losses can be minimized with suitable layer system both on the homogenizer and on the laser medium.

In the case of the laser diodes usually used, a collimation in the fast axis already takes place on the emitter side. This is focused again by a cylindrical lens arranged downstream of the pump source. The focusing sought, e.g. $d_y=100-880$ μm, can readily be achieved by this means.

This arrangement gives rise, at the end of the homogenizer and upstream of the laser medium, that is to say at the transition between these two components, to a homogeneous radiation field having, however, high divergence in the homogenization direction. Dispensing with beam shaping downstream of the homogenizer, e.g. in the form of further lenses, can be supported, for example, by a coating that optimizes the transmission, wherein a high transmission also has to be ensured in the case of the large angles that occur.

If appropriate, the beam guidance of the laser light to be amplified by the laser medium can take place from the opposite side, such that the connection of medium—rod can be designed to be extremely highly transmissive to the pump light, but reflective to the laser light—e.g. by means of spectrally selective coating. Moreover, the latter is also intended to be transmissive for the full angular range of the divergence, e.g. up to 60°, that is say to enable a high transmission for a large angle-of-incidence range.

This arrangement of the two components has the effect that a continuous beam guidance from the homogenizer into the laser medium is achieved, wherein both components are connected to one another, i.e. are in contact with one another, or else are positioned at a small distance from one another. This distance is governed by the pump effect to be obtained in the laser medium, that is say the width of the pump beam line. The distance can then be chosen depending on the properties of the intermixed beam in the homogenizer, that is to say, in particular, its beam cross section generated there and its beam divergence. In contrast to the use of optical units between homogenizer and laser medium, the beam is directly guided further, such that no further elements that alter the beam characteristic are arranged between the components. This concerns, in particular, the retention of the beam divergence present at the exit of the homogenizer. In this sense, the beam path is continued directly without any influencing of the beam characteristic from homogenizer to laser medium. This becomes clear in the case of direct contact-making with fixing and transmission-optimizing connection of both components, which can be achieved e.g. by cementing or diffusion bonding.

Homogenizer and laser medium thus form a continuous planar waveguide, which, if appropriate, in some embodiments, can be interrupted by a narrow, but divergence-retaining free-radiation region.

This direct beam continuation can make it necessary to carry out divergence compensation in the laser medium, said divergence compensation being possible, for example, as a result of highly polished or coated lateral areas of the medium.

Perpendicularly to the intermixing axis, the partial pump radiation of an emitter is guided either directly and without any influencing of the divergence or else by means of focusing through the homogenizer, i.e. the latter intermixes only in one axis, whereas in the other axis direct projection onto the laser medium takes place rather than intermixing. The combination of high divergence in the intermixing axis and low divergence or, if appropriate, focusing in the projection axis brings about a highly elliptical beam cross section of the pump light.

The pump arrangement according to the invention and the pump method according to the invention are described or explained in greater detail purely by way of example below on the basis of exemplary embodiments illustrated schematically in the drawing, in which, specifically:

FIGS. 1A-C show the schematic illustration of a first exemplary embodiment of the pump arrangement according to the invention;

FIGS. 2A-E show the schematic illustration of a second exemplary embodiment of the pump arrangement according to the invention with variants of a focusing in the projection axis;

FIG. 3 shows the schematic illustration of a third exemplary embodiment of the pump arrangement according to the invention;

FIG. 4 shows the schematic illustration of a fourth exemplary embodiment of the pump arrangement according to the invention;

FIG. 5 shows the schematic illustration of a fifth exemplary embodiment of the pump arrangement according to the invention;

FIG. 6 shows the schematic illustration of a sixth exemplary embodiment of the pump arrangement according to the invention;

Figure 10:
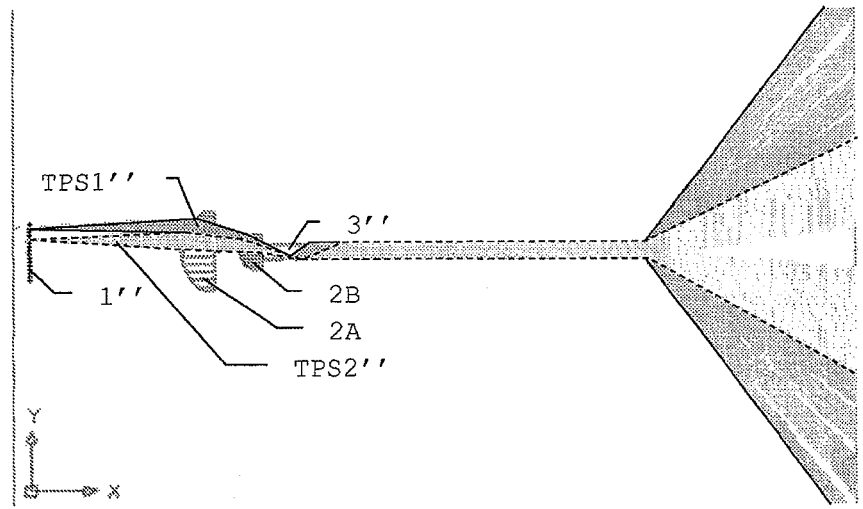
Figure 10:
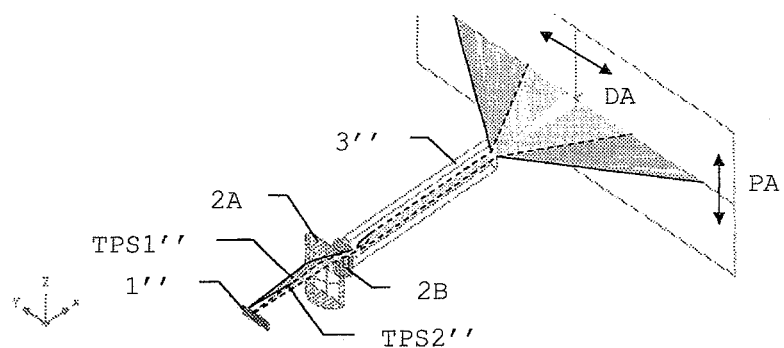
Figure 10C:
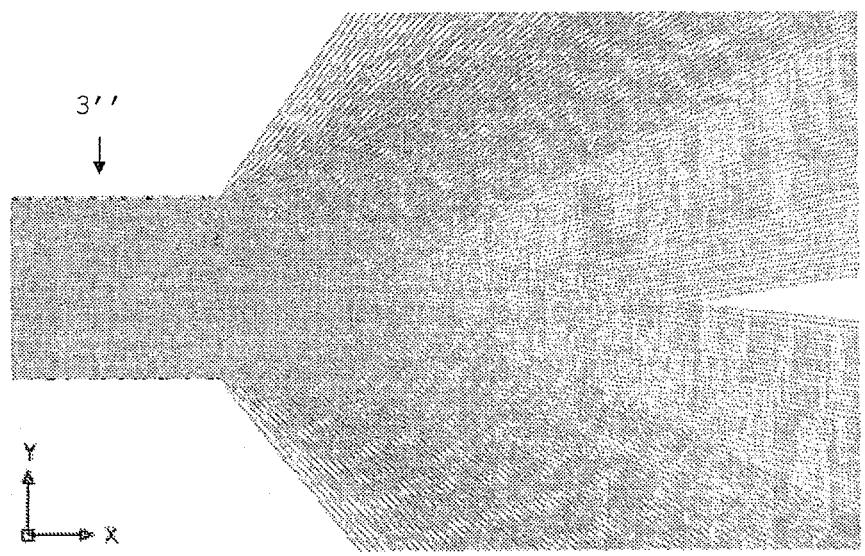
Figure 10D:
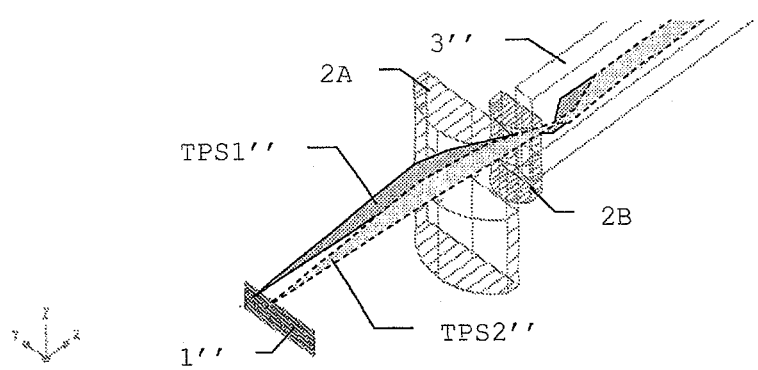
Figure 11:
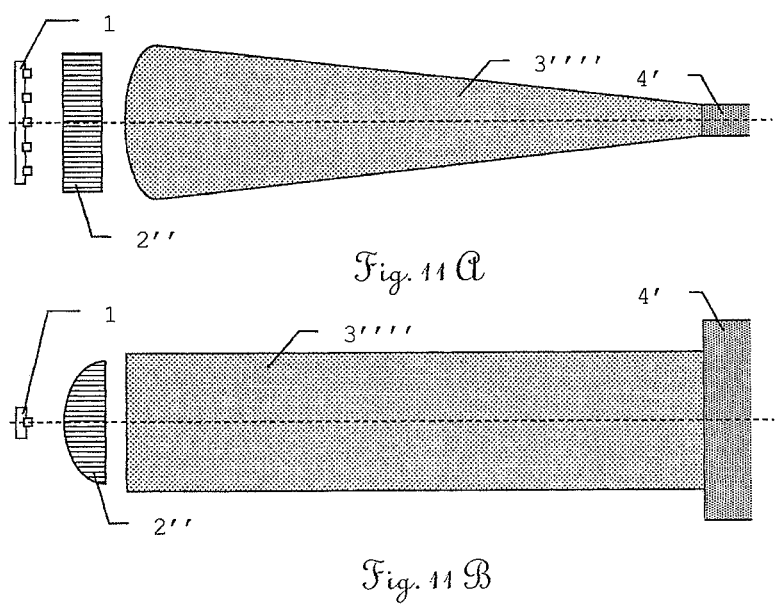

FIGS. 7A-B show the schematic illustration of a seventh exemplary embodiment of the pump arrangement according to the invention;

FIG. 8 shows the schematic illustration of an eighth exemplary embodiment of the pump arrangement according to the invention;

FIGS. 9A-D show the illustration of a first example of the beam path of the pump arrangement according to the invention;

FIGS. 10A-D show the illustration of a second example of the beam path of the pump arrangement according to the invention and FIGS. 11A-B show the schematic illustration of an eighth exemplary embodiment of the pump arrangement according to the invention.

Figure 1:
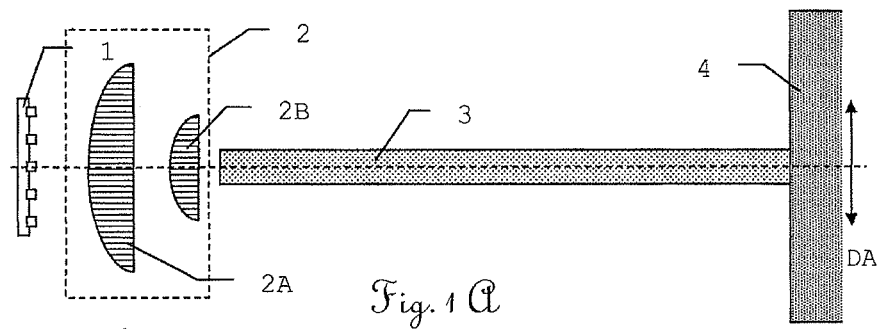
Figure 1:
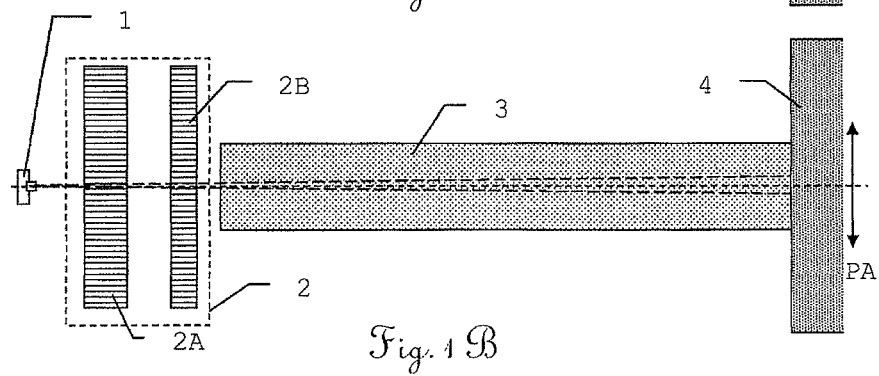
Figure 1:
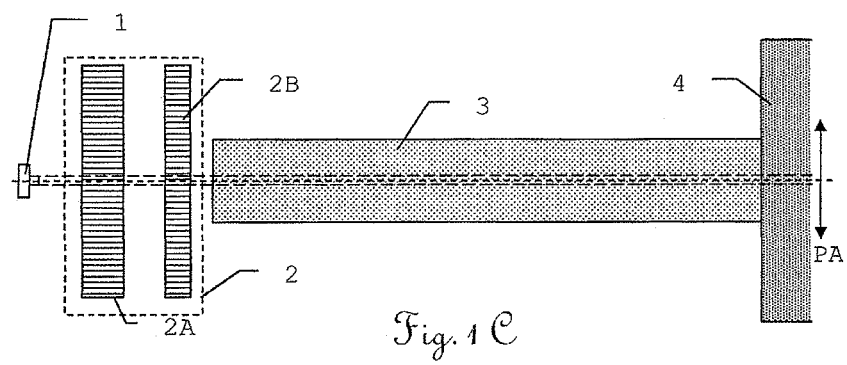

FIGS. 1A-C show the schematic illustration of a first exemplary embodiment of the pump arrangement according to the invention, wherein FIG. 1A illustrates a plan view and FIG. 1B and FIG. 1C each illustrate a side view for different divergences of the emitted pump radiation.

The pump arrangement for a laser medium that amplifies laser radiation has at least one laser pump source 1 having a plurality of elements for generating partial pump beams. In this case, use is usually made of laser diodes which are arranged one above another or alongside one another and the laser radiation of which is used for pumping the laser medium 4.

The partial beam bundles emitted by said laser pump source 1 are intermixed in an optical homogenizer 3, disposed downstream of the laser pump source 1, in an intermixing axis DA. Said homogenizer has in this exemplary embodiment as a homogenizer rod a rectangular cross section, wherein the dimensioning thereof just like the length of the rod are dependent both on the laser pump source 1, e.g. number of and distance between the individual emitters, and also on the laser medium 4, e.g. the material thereof. Generally, the homogenizer 3 will have a narrower side, which, purely by way of example, brings about the intermixing by means of multiple reflections at this area within the rod and in the intermixing axis DA, whereas a focusing can take place in the wider side. For this purpose, however, other geometries deviating from a parallelepiped or rod can also be used according to the invention, wherein an intermixing can also be effected by the wider side. In order to ensure loss-free reflections during intermixing, the homogenizer 3 can have polished or coated side areas. In this case, the intermixing or mixing is based on the different angle of incidence into the homogenizer 3 that is governed by the different position of the individual emitters, wherein the partial pump beam paths with their divergence are interlaced and thus intermixed by means of a multiplicity of reflections.

In addition to the intermixing, in a projection axis PA perpendicular to the intermixing axis DA, the partial pump beams generated by the emitters of the laser pump source 1 are directly projected onto the laser medium 4, that is to say that no intermixing corresponding to the intermixing axis DA or no influencing of the beam divergence or beam convergence by further components takes place in this axis. This projection is shown in dashed fashion in FIG. 1A. The emission of the laser pump source 1 is thus guided in the projection axis PA with the original divergence—or divergence only influenced by a microlens on the emitter—through the homogenizer 3 with maintenance of the beam divergence directly onto the laser medium. For this purpose, the partial pump beams are guided via a coupling-in optical unit 2 into the homogenizer 3, wherein said coupling-in optical unit 2, in the embodiment illustrated, purely by way of example, has two cylindrical coupling-in lenses 2A and 2B which enable, alongside the projection onto or into the laser medium 4, the gathering and coupling of the partial beam bundles into the homogenizer 3 and also an influencing of the intermixing.

FIG. 1C shows an exemplary embodiment analogous to FIG. 1B, in which, through the choice of a different microlens, e.g. in this case a microlens having a comparatively longer focal length on the emitter of the laser pump source 1, a smaller divergence in the projection axis PA is achieved and, as a result, the pump spot is made significantly more elliptical in the laser medium.

Homogenizer 3 and laser medium 4 are again designed and arranged such that the pump beam that emerges from the homogenizer 3 and is composed of the intermixed partial pump beams is also guided in the intermixing axis DA directly onto or into the laser medium 4. This direct coupling-in without further interposed beam-altering components realizes optically a continuous component composed of homogenizer 3 and laser medium 4, wherein maintenance of divergence takes place at the transition location of homogenizer 3 and laser medium 4 in this case for intermixing axis DA and projection axis PA. With a correspondingly shaped laser medium 4, this arrangement is therefore similar to a continuous planar waveguide.

In this case, subsequently in the laser medium 4, divergence-compensating reflections can take place or else the pump beam is guided further here in a divergence-maintaining manner without further reflection. In the case of reflections in the laser medium 4, the latter can have polished or coated side areas for divergence compensation.

In this first exemplary embodiment, for this purpose both components are arranged such that the homogenizer 3 makes contact with the laser medium 4, wherein, alongside unfixed abutment against one another, a fixed connection by cementing or diffusion bonding is also possible according to the invention. A correspondingly mechanically stable connection additionally contributes to the robustness of the arrangement and makes it possible to dispense with the adjustment complexity required in the case of interposed optical units. Furthermore, the homogeneity of the pump spot is maintained, which, in the case of an interposed optical unit, requires a particularly high-quality and costly embodiment of said optical unit in order to achieve a high-quality imaging despite high divergences. Imaging aberrations or aberrations of said optical unit could otherwise impair the homogeneity of the pump spot. In this case, the homogeneity of the pump spot directly influences the beam quality obtained in the case of high beam power, which constitutes a crucial parameter for many applications.

Depending on the laser medium 4, the beam profile arising at the exit of the homogenizer 3 can then already substantially correspond in shape and size to the pump beam profile in the laser medium 4 or else assume the required cross section only there as a result of the divergence of the radiation.

FIG. 2 shows the schematic illustration of a second exemplary embodiment of the pump arrangement according to the invention with variants of a focusing in the projection axis. In comparison with FIGS. 1A-C, a fundamentally identical construction and an identical homogenizer 3 are used, FIGS. 2A-B and FIGS. 2C-D in each case illustrating different variants of the focusing. In the variant in FIGS. 2A-B, the coupling-in optical unit 2' there has two planoconvex coupling-in lenses 2A' and 2B', wherein coupling-in optical unit 2' is also designed for focusing in the projection axis. In this construction, therefore, an intermixing in the intermixing axis takes place with simultaneous focusing in the projection axis perpendicular thereto. In the variant in FIGS. 2C-D, the coupling-in optical unit 2" has two cylindrical coupling-in lenses 2A" and 2B", analogously to the exemplary embodiment in FIGS. 1A-C, and additionally a cylindrical lens 2C" acting in the projection axis.

According to the invention, the approach that does not influence the beam divergence in the projection axis and also the focusing approach can be combined with the exemplary embodiments presented below, such that usually a presentation is effected in only one axis. The person skilled in the art can derive further examples according to the invention for optical imaging systems which in the intermixing axis generate the suitable imaging into the homogenizer and at the same time in the projection axis generate a suitable pump spot radius in the laser medium and thus achieve the desired ellipticity of the pump spot and pump intensity.

Moreover, the coupling-in optical unit 2, 2' or 2" according to the invention can be integrated wholly or partly into the homogenizer, e.g. by the entrance window being provided with a curvature or the homogenizer being divided. Specific examples thereof are illustrated schematically in FIG. 2E and FIGS. 11A-B, but the principle of the integration of further optical functions beyond pure intermixing into the homogenizer is also applicable to other exemplary embodiments according to the invention. However, this can cause an increased complexity on the component side, whereas a separate coupling-in optical unit permits the use of homogenizers having planar surfaces.

The variant in FIG. 2E uses the coupling-in optical unit 2 of the first exemplary embodiment from FIGS. 1A-B with two cylindrical coupling-in lenses 2A and 2B, but now the homogenizer is divided into a first homogenizer component 3A and a second homogenizer component 3B, wherein these components can be connected to one another or mutually fixed by a carrier component 3C. The second homogenizer component 3B is designed such that, alongside the intermixing, it also provides a fixing effect, wherein, however, first and second homogenizer components 3A and 3B form a continuous homogenizer.

FIG. 3 shows the schematic illustration of a third exemplary embodiment of the pump arrangement according to the invention, having a fundamentally identical construction in comparison with FIGS. 1A-C or FIGS. 2A-E. As in the following FIGS. 4-6 as well, only the plan view, i.e. the intermixing axis, is shown in this case, such that the direct projection without focusing in accordance with FIGS. 1A-C or the projection with focusing in accordance with FIGS. 2A-E can be realized according to the invention for the projection axis. In this embodiment, homogenizer 3 and laser medium 4 do not touch one another, but rather are positioned at a slight distance from one another. In this case, the corresponding distance between homogenizer 3 and laser medium 4 can be chosen to be less than the smallest diameter of a cross section of the emerging pump beam or smaller than the smallest edge length of the homogenizer 3; in particular, it can be between 100 and 880 μm, for example 300 or 500 μm.

A fourth exemplary embodiment of the pump arrangement according to the invention is shown in FIG. 4, homogenizer 3 and laser medium 4 being connected to one another in this exemplary embodiment. However, a transmission-increasing layer 5 is arranged at the contact location between these two components, which layer was applied to the homogenizer 3 during production in this example. However, such a transmission-increasing layer 5 is not necessary in all cases; by way of example, it can be dispensed with if the refractive indices of the two materials used for homogenizer 3 and laser medium 4 are close together.

If the laser medium 4 is used as a mirror element, e.g. for beam folding in the resonator or as an end mirror, then the laser radiation to be amplified can be passed into the laser medium 4 from the opposite side to the homogenizer 3. In this case, the transmission-increasing layer 5' can be applied over the whole area onto that area of the laser medium 4 which faces the homogenizer 3, wherein said area is designed to be reflective to laser radiation to be amplified as a useful signal, but transmissive to the pump radiation. This can be achieved, for example, by means of a spectrally selective reflection and transmission effect for the different wavelengths of pump and useful signal radiation, such that the pump radiation is coupled in optimally with reflection of the laser radiation to be amplified in the laser medium 4. This case is illustrated as a fifth exemplary embodiment in FIG. 5.

A sixth exemplary embodiment of the pump arrangement according to the invention is finally shown in FIG. 6, in which exemplary embodiment the features of the transmission-increasing and spectrally selectively reflective layer 5' applied over the whole area onto the laser medium 4 are combined with spacing apart the homogenizer 3.

FIGS. 7A-B schematically show a seventh exemplary embodiment of the pump arrangement according to the invention, once again with illustration of projection and intermixing axes. In this case, the construction corresponds, in principle, to the second exemplary embodiment in accordance with FIGS. 2A-B with focusing in the projection axis. However, in this exemplary embodiment, the laser medium 4' and homogenizer 3 are coordinated with one another such that the laser medium 4' in continuation of the homogenizer 3 at least in the intermixing axis acts as a waveguide. In this case, a matching of homogenizer cross section and cross section of the laser medium 4' can also be effected—in a departure from the exemplary embodiment shown—in the projection axis.

FIG. 8 shows an eighth exemplary embodiment of the pump arrangement according to the invention wherein only the intermixing axis is illustrated. In this case, the construction of the coupling-in optical unit 2" is identical to the arrangement illustrated in FIGS. 2C-D, but in this exemplary embodiment a coating 6 is introduced into the homogenizer 3''', said coating being transmissive to the pump radiation and reflective to the radiation of the useful signal 7. For this purpose, the useful signal 7 is coupled laterally into the homogenizer 3''' and emitted as an amplified exit beam 7' after amplification in a laser medium 4", which is trapezoidal in this exemplary embodiment. This amplifier arrangement can be used, for example, for external post-amplification of laser beams or, alternatively, for resonator-internal amplification.

The examples shown in FIGS. 9A-D and 10A-D were created by means of ray tracing, wherein the focusing—likewise possible according to the invention, in the non-homogenizing plane has deliberately been dispensed with for illustration reasons. In both examples, lenses from the manufacturer Thorlabs of the type LJ1095L1-B and LJ1874L1-B are used as coupling-in lenses 2A and 2B, wherein the first lens LJ1095L1-B is positioned at a distance of $d_1=28$ mm from the laser pump source 1' and the second lens LJ1874L1-B is positioned at a distance of $d_2=4.5$ mm from the first lens. The distance between second lens LJ1874L1-B and the homogenizer 3' is $d_3$=0.3 mm.

In FIGS. 9A-D, two partial pump beams TPS1' and TPS2' are calculated for the emitter lying in the center and the emitter lying at an edge in a laser diode stack having a width of 5 mm as laser pump source 1'. The half angle of the divergence in the slow axis is 3-4° and the homogenizer 3' is embodied as a quartz glass rod having a length of 70 mm and a width of 3 mm in the intermixing axis. The pump method according to the invention will be explained on the basis of a first example of the beam path of the pump arrangement according to the invention. By means of two different emitters of the laser pump source 1' that are spaced apart from one another, partial pump beams TPS1' and TPS2' for pumping the laser medium 4 are generated and passed into the homogenizer 3' through a downstream coupling-in optical unit composed of two cylindrical lenses as coupling-in lenses 2A and 2B, wherein at least one cylindrical coupling-in lens is oriented with its longitudinal axis in the direction of the intermixing axis. The partial pump beams TPS1' and TPS2' are intermixed there in at least one axis by means of multiple reflections, such that a pump beam for the laser medium 4 is generated from the intermixed partial pump beams TPS1' and TPS2'. Only two partial pump beams TPS1' and TPS2' are illustrated in this figure, purely for illustration reasons. According to the invention, however, the emissions of a larger number of emitters are intermixed. During the process of generating the pump beam for the laser medium, the partial pump beams TPS1' and TPS2' are passed directly onto or into the laser medium 4 after intermixing. By way of example, an elliptical beam profile of the pump beam can be produced by means of different divergences in the two axes of the intermixed partial pump beams TPS1' and TPS2'. This is brought about by the homogenizer 3' having a dimensioning which produces an elliptical beam profile of the emerging pump beam, in particular by means of the targeted generation or maintenance of different beam divergences in the two axes, wherein, depending on the application purpose or laser medium 4 used, a complete or else only partial intermixing can take place in the width of the elliptical beam profile.

Figure 9:
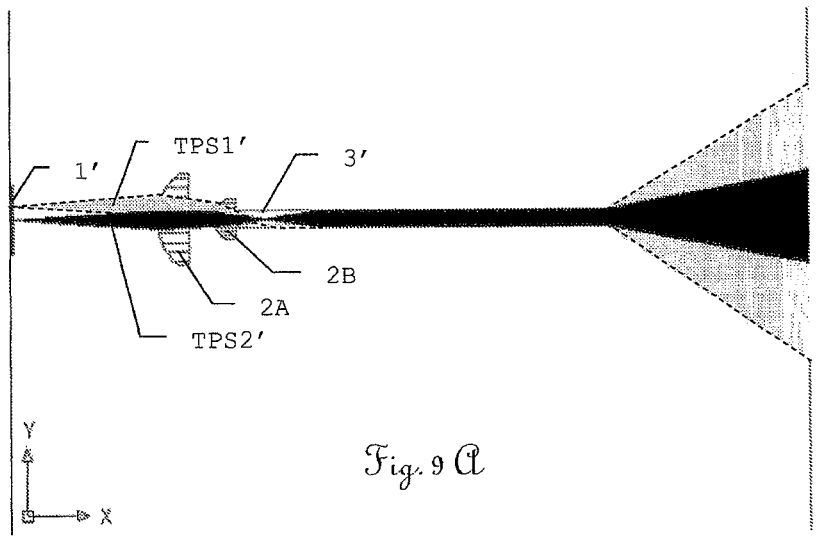
Figure 9:
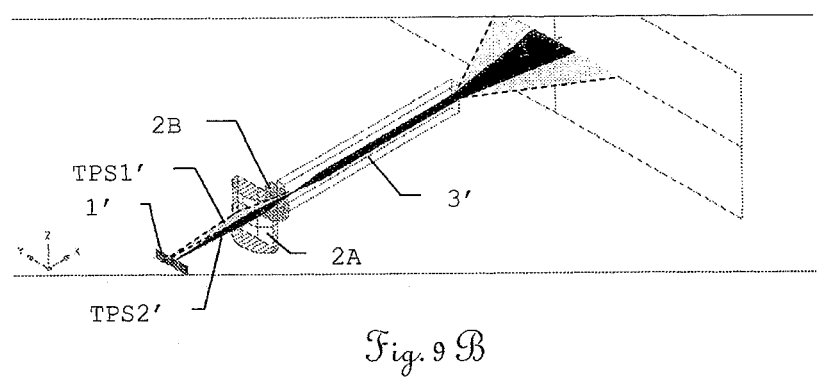

As can be seen from FIG. 9B, the pump beam has at the exit of the homogenizer 3' a high divergence in this axis. The divergence in the other axis can remain uninfluenced by the homogenizer 3', such that an elliptical pump light spot arises. According to the invention, however, focusing can also be effected, such that pump light spots or beam cross sections of the pump beam can also be adapted to a desired cross section or a beam profile which are more or less elliptical.

Figure 9C:
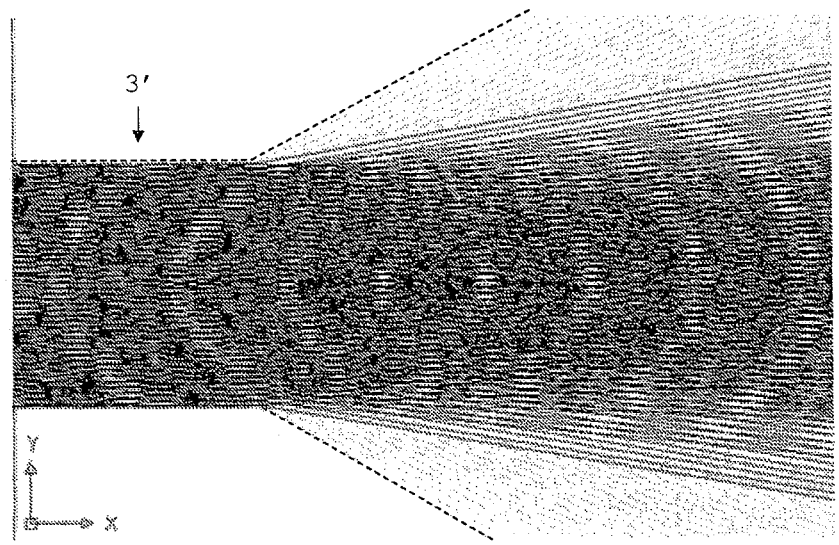
Figure 9D:
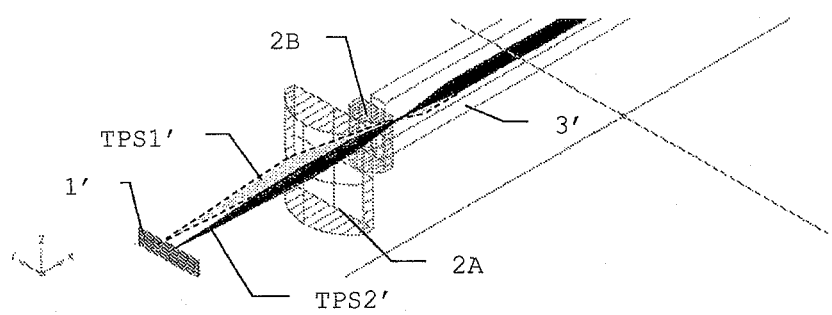

FIG. 9C shows the divergence in the intermixing axis at the end of the homogenizer 3' in detail. FIG. 9D elucidates the coupling-in optical unit having the two coupling-in lenses 2A and 2B in an enlarged view.

FIGS. 10A-D show the illustration of a second example of the beam path of the pump arrangement according to the invention. A laser diode stack having a width of 10 mm serves as a laser pump source 1" which generates the two partial pump beams TPS1" and TPS2", the emissions of emitters lying in the center and at an edge once again being considered in said stack. The half angle of the divergence in the slow axis is 3-4° and the homogenizer 3" is embodied as a quartz glass rod having a length of 160 mm and a width of 7 mm in the intermixing axis.

As also in the first example illustrated in FIG. 10B, in this case as well, the pump beam at the exit of the homogenizer 3" has a high divergence in the intermixing axis DA with low divergence in the projection axis PA, such that an elliptical pump light spot arises. FIG. 10C shows this divergence of the intermixing axis at the end of the homogenizer 3" in detail. FIG. 10D elucidates the coupling-in optical unit having the two coupling-in lenses 2A and 2B in an enlarged view.

FIGS. 11A-B schematically illustrate an eighth exemplary embodiment of the pump arrangement according to the invention, in which exemplary embodiment a homogenizer 3"" provided with an aperture angle in the intermixing axis is used. In this case, the aperture angle is adapted to the divergence, wherein, moreover, the entrance window has a curved shape, such that a lens effect is obtained. In this exemplary embodiment, therefore, part of the functionality of the coupling-in optical unit is transferred into the homogenizer 3"". In the projection axis, focusing is effected by means of a cylindrical lens 2", such that the pump spot geometry to be obtained in this axis is produced directly.

It goes without saying that the illustrated pump arrangement and pumped laser systems merely constitute exemplary embodiments of many embodiments that can be realized according to the invention, and the person skilled in the art can derive alternative forms of realization of the pump and laser construction, e.g. using other lens parameters or arrangements, types of homogenizer or pumped media, such as e.g. disc lasers.

The invention claimed is:

1. A laser pump arrangement for producing elliptical pump geometries with ratios of pump light spot length to width of greater than 3:1 at the transition between a homogenizer and a laser medium that amplifies laser radiation, comprising at least
  one laser pump source having a plurality of emitters for generating partial pump beams, in particular laser diodes, for pumping the laser medium,
  one optical homogenizer for intermixing the partial pump beams in an intermixing axis by means of multiple reflections so that a complete or partial intermixing is achieved in the width of the elliptical beam profile,
  one coupling-in optical unit between laser pump source and homogenizer,
wherein
  the coupling-in optical unit is designed and arranged such that the partial pump beams in a projection axis perpendicular to the intermixing axis are projected, in particular focused, directly onto or into the laser medium and
  homogenizer and laser medium are designed and arranged such that the pump beam emerging from the homogenizer is passed directly onto or into the laser medium with maintenance of divergence for the intermixing axis.

2. A laser pump arrangement for producing elliptical pump geometries with ratios of pump light spot length to width of greater than 3:1 at the transition between a homogenizer and a laser medium that amplifies laser radiation, comprising at least
  one laser pump source having a plurality of emitters for generating partial pump beams, in particular laser diodes, for pumping the laser medium,
  one optical homogenizer for intermixing the partial pump beams in an intermixing axis by means of multiple reflections so that a complete or partial intermixing is achieved in the width of the elliptical beam profile,
  one coupling-in optical unit between laser pump source and homogenizer,
wherein
  emitters, coupling-in optical unit and homogenizer are designed and arranged such that they generate in interaction at the exit of the homogenizer a pump beam having the elliptical pump geometry, wherein the partial pump beams, in a projection axis perpendicular to the intermixing axis, are projected, in particular focused, onto or into the laser medium with maintenance of divergence for the projection axis, and the pump beam emerging from the homogenizer is passed directly onto or into the laser medium with maintenance of divergence for the intermixing axis.

3. The laser pump arrangement as claimed in claim 1, wherein the homogenizer has a dimensioning which produces an elliptical beam profile of the emerging pump beam, in particular by means of different beam divergences in intermixing axis and projection axis.

4. The laser pump arrangement as claimed in claim 3, wherein the beam profile substantially corresponds in shape and size to the pump beam profile in the laser medium.

5. The laser pump arrangement as claimed in claim 3, wherein a complete intermixing takes place in the width of the elliptical beam profile.

6. The laser pump arrangement as claimed in claim 1, wherein the distance between homogenizer and laser medium is less than the smallest diameter of a cross section of the emerging pump beam or the smallest edge length of the homogenizer.

7. The laser pump arrangement as claimed in claim 1, wherein the homogenizer makes contact with the laser medium, in particular is connected to the latter.

8. The laser pump arrangement as claimed in claim 1, wherein a transmission-increasing layer is arranged between homogenizer and laser medium.

9. The laser pump arrangement as claimed in claim 8, wherein the transmission-increasing layer is reflective to the laser radiation to be amplified, in particular by means of a spectrally selective reflection.

10. The laser pump arrangement as claimed in claim 1, wherein the homogenizer has polished or coated side areas for producing the intermixing of the partial pump beams in at least the intermixing axis.

11. The laser pump arrangement as claimed in claim 1, wherein the coupling-in optical unit has at least one cylindrical coupling-in lens wherein the longitudinal axis thereof is oriented perpendicularly to the intermixing axis.

12. The laser pump arrangement as claimed in claim 11, wherein the at least one cylindrical coupling-in lens is designed and arranged such that beam divergences of the partial pump beams, are at least maintained or increased in the intermixing axis.

13. A laser system comprising a laser medium in a resonator for amplifying laser radiation and a laser pump arrangement as claimed in claim 1.

14. The laser system as claimed in claim 13, wherein the laser medium has polished or coated side areas for divergence compensation.

15. A laser pump method for producing elliptical pump geometries with ratios of pump light spot length to width of greater than 3:1 at the transition between a homogenizer and a laser medium that amplifies laser radiation, comprising emitting partial pump beams, for pumping the laser medium, intermixing the partial pump beams in an intermixing axis by means of multiple reflections so that a complete or partial intermixing is achieved in the width of the elliptical beam profile in a homogenizer, generating a pump beam for the laser medium from the intermixed partial pump beams, wherein when generating the pump beam the partial pump beams in a projection axis perpendicular to the intermixing axis, are projected, in particular focused, directly onto or into the laser medium and after intermixing, are passed directly onto or into the laser medium with maintenance of divergence in the intermixing axis.

16. The laser pump method as claimed in claim 15, wherein in the generating process, an elliptical beam profile of the pump beam is produced by means of different divergences of the intermixed partial pump beams in the intermixing axis and the projection axis.

17. The laser pump arrangement as claimed in claim 1, wherein the distance between the homogenizer and laser medium is in the range of 100 μm to 880 μm.

* * * * *